United States Patent
Chang et al.

(10) Patent No.: US 9,529,268 B2
(45) Date of Patent: Dec. 27, 2016

(54) SYSTEMS AND METHODS FOR IMPROVING PATTERN TRANSFER

(71) Applicant: Taiwan Semiconductor Manufacturing Company, Ltd., Hsin-Chu (TW)

(72) Inventors: Shih-Ming Chang, Hsinchu County (TW); Chien-Fu Lee, Hsinchu (TW); Hoi-Tou Ng, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 238 days.

(21) Appl. No.: 14/243,985

(22) Filed: Apr. 3, 2014

(65) Prior Publication Data
US 2015/0286146 A1 Oct. 8, 2015

(51) Int. Cl.
*G03F 7/20* (2006.01)
(52) U.S. Cl.
CPC ....... *G03F 7/70058* (2013.01); *G03F 7/70483* (2013.01)
(58) Field of Classification Search
CPC .................. G03F 7/70058; G03F 7/70125
USPC .......................................................... 355/67
See application file for complete search history.

(56) References Cited

U.S. PATENT DOCUMENTS

| | | | | |
|---|---|---|---|---|
| 2002/0152452 A1* | 10/2002 | Socha | ............... | G03F 1/144 716/54 |
| 2004/0003368 A1* | 1/2004 | Hsu | ............... | G03F 1/144 716/53 |
| 2004/0184030 A1* | 9/2004 | Liebchen | ............... | G03F 7/705 356/124 |
| 2004/0197672 A1* | 10/2004 | Weed | ............... | G03F 7/70091 430/5 |
| 2005/0031974 A1* | 2/2005 | Fukuhara | ............ | G01N 21/95607 430/30 |
| 2006/0017903 A1* | 1/2006 | Bleeker | ............... | G03F 7/70525 355/67 |
| 2007/0031744 A1* | 2/2007 | Crouse | ............... | G03F 1/144 430/30 |
| 2007/0178411 A1* | 8/2007 | Setta | ............... | G03F 7/70091 430/311 |
| 2007/0211231 A1* | 9/2007 | Suda | ............... | G03F 7/70158 355/2 |
| 2007/0222979 A1* | 9/2007 | Van Der Laan | .... | G03F 7/70683 356/243.1 |
| 2008/0285001 A1* | 11/2008 | Schneider | ............ | G03F 7/70116 355/67 |

(Continued)

*Primary Examiner* — Steven H Whitesell Gordon
(74) *Attorney, Agent, or Firm* — Haynes and Boone, LLP (57) ABSTRACT

Provided herein is a method of improving a transference of a mask pattern into a material layer on a semiconductor wafer. The method includes steps of receiving a semiconductor mask made from a desired design layout and of patterning the material layer present on a plurality of semiconductor wafers with the mask having the mask pattern and an illumination pattern. The method further includes steps of identifying defects and/or defect patterns in the transference of the mask pattern on the plurality of semiconductor wafers, determining an illumination modification, and applying the illumination modification to the illumination pattern to create a modified illumination pattern. Additional methods and associated systems are also provided.

20 Claims, 6 Drawing Sheets

(56) References Cited

U.S. PATENT DOCUMENTS

| | | | |
|---|---|---|---|
| 2009/0180088 A1* | 7/2009 | Schroeder | G03F 7/701 355/53 |
| 2010/0110407 A1* | 5/2010 | Kobayashi | G03B 27/72 355/71 |
| 2011/0022994 A1* | 1/2011 | Hu | G03F 1/144 716/55 |
| 2012/0054697 A1* | 3/2012 | Takahata | G03F 7/70125 716/55 |

* cited by examiner

SYSTEMS AND METHODS FOR IMPROVING PATTERN TRANSFER

BACKGROUND

The semiconductor integrated circuit industry has experienced rapid growth in the past several decades. Technological advances in semiconductor materials and design have produced increasingly smaller and more complex circuits. These material and design advances have been made possible as the technologies related to processing and manufacturing have also undergone technical advances. In the course of semiconductor evolution, the number of interconnected devices per unit of area has increased as the size of the smallest component that can be reliably created has decreased.

As the sized has decreased, maintaining the reliability in patterning processes and the yields produced by the patterning processes has become more difficult. In some cases, the use of optical proximity correction and the adjustment of lithography parameters such as the duration of a process, the wavelength, focus, and intensity of light used can mitigate some defects.

However, the current and systems for patterning material layers in semiconductor wafers has not been entirely satisfactory.

BRIEF DESCRIPTION OF THE DRAWINGS

Aspects of the present disclosure are best understood from the following Detailed Description when read with the accompanying figures. It is noted that, in accordance with the standard practice in the industry, various features are not drawn to scale. In fact, the dimensions of the various features may be arbitrarily increased or reduced for clarity of discussion.

For clarity of discussion, elements having the same designation in the drawings may have the same or similar functions. The drawings are better understood by reference to the following Detailed Description.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Additionally, some embodiments include non-transient, machine-readable media that include executable code that when run by a processor, may cause the processor to perform some, all, or portions of the steps of methods described herein.

Figure 1:
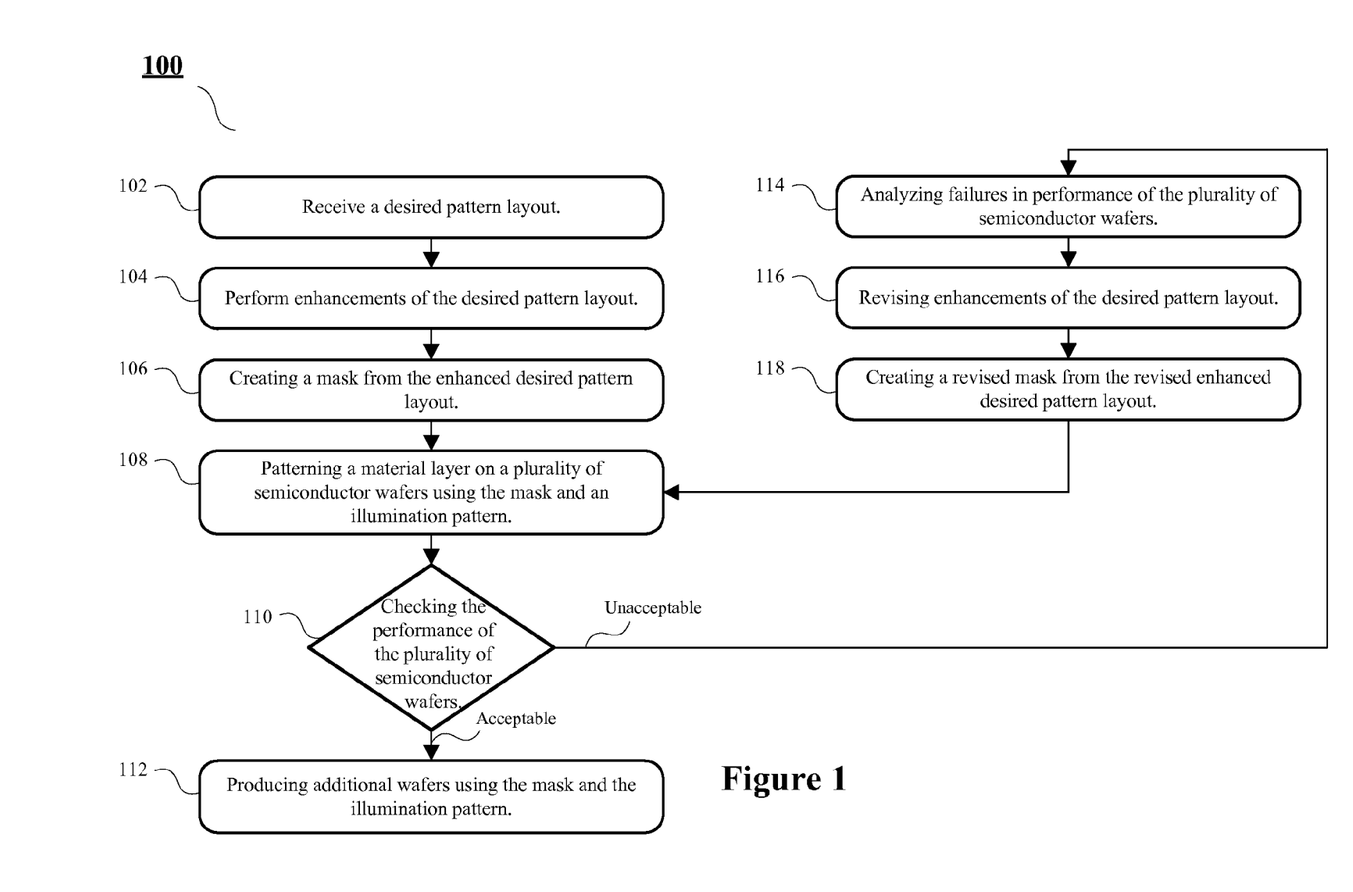
FIG. 1 is a flowchart of a method for improving the performance of semiconductor wafer production.

Referring now to FIG. 1, shown therein is a flowchart of a method 100 for improving the performance of semiconductor wafer fabrication. As illustrated, method 100 begins in step 102 with the reception of a desired pattern layout that is to be transferred, by use of a corresponding mask, to a material layer on one or more semiconductor wafers in a photolithography process. The desired pattern layout includes geometric features that may form part of passive devices, such as resistors, capacitors, etc., and active devices, such as transistors as used in a circuit. The layout may be received in an electronic file format, such as a GDSII format or comparable formats known in the art or hereafter developed, on a workstation used in the design and implementation of semiconductor layouts. Many such layouts are used in the fabrication of a single semiconductor device.

Figure 2A:
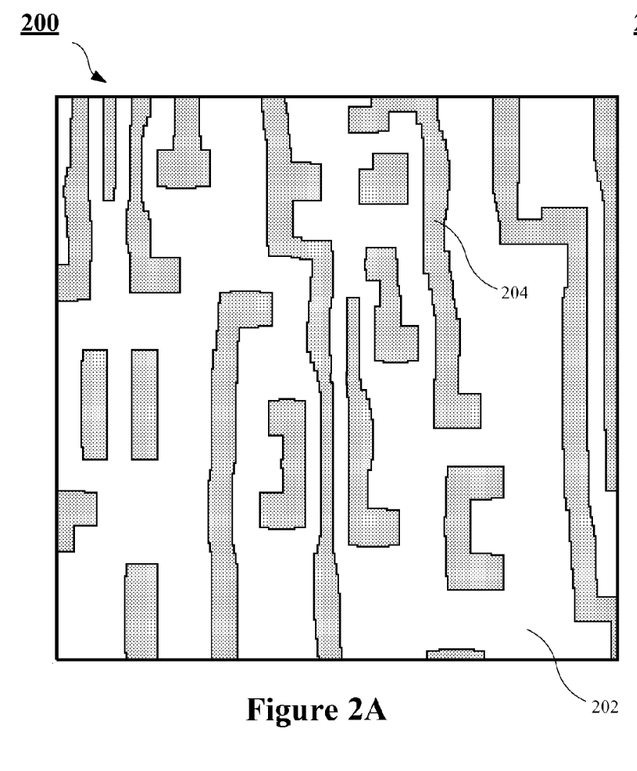
FIG. 2A is a diagram of a desired pattern layout having a plurality of enhancements added to the pattern.

As the smallest feature size to be formed in the material layers of semiconductor devices has decreased, a number of techniques have been developed to maintain the desired transfer of patterns from mask to material layer. In step 104, enhancements are performed to the desired pattern layout to increase the fidelity of features formed in the material layer. For example, optical proximity correction (OPC) features may be used to adjust the contours of the desired pattern layout in order to improve the pattern transfer. An exemplary enhanced desired pattern layout 200 is shown in FIG. 2A. The layout 200 includes a background field 202 and a plurality of pattern features, such as the pattern feature 204. In some embodiments, the layout 200 may include additional enhancements such as sub-resolution assist features (SRAFs) and others (not illustrated).

In step 106, the enhanced desired pattern layout is implemented in a corresponding semiconductor mask. This may be done using a conventional mask fabrication process by which an opaque layer of material is formed over a transparent substrate and subsequently patterned by a material removal process. For example, the mask may include a quartz substrate with a layer of chrome deposited thereover. In other embodiments, the semiconductor mask is a phase-shifting mask and may be designed for use with extreme ultraviolet (EUV) light to pattern a layer, such as a photoresist layer, which may then be used to pattern an underlying, target material layer.

Figure 4:
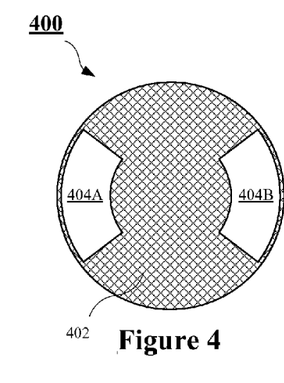
FIG. 4 is an illumination pattern as used in a photolithography system.

After the mask is fabricated, it is used in step 108 to pattern a material layer on a plurality of semiconductor wafers with an illumination pattern 400, such as that shown in FIG. 4. The mask and the illumination pattern are part of an optical path between a light source, such as an EUV lamp, and a photoresist layer. In some embodiments, many different combinations of photolithography parameters, such as dosage and focus may be applied to create a plurality of test wafers in order to identify the preferred settings.

Figure 2B:
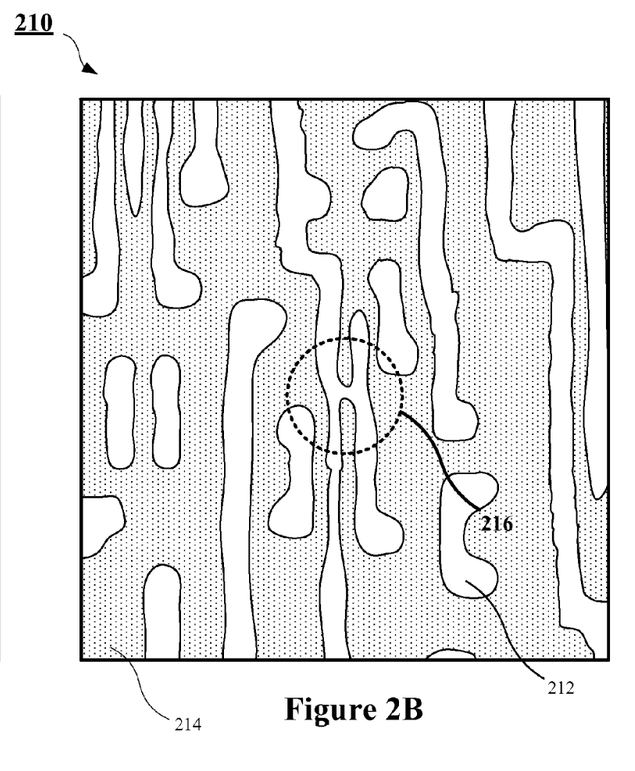
FIG. 2B is an exemplary image of a material layer on a semiconductor wafer patterned using the layout of FIG. 2A.

In step 110, the performance of the plurality of test wafers is checked. This may be done by determining automatically, or manually, critical dimensions or other standards achieved in the test wafers. If an acceptable wafer (or wafers) is identified, additional wafers may be patterned using the mask and the optimal dosage and focus settings, in step 112. In some instances, no acceptable wafer is identified. In such a situation, an analysis of the failures of the plurality of test wafers is performed in step 114. This is done to identify a particular failure and/or patterns of failures on the wafers. For example, FIG. 2B is an exemplary image 210 of a patterned material layer on a semiconductor wafer. The exemplary image 210 includes a plurality of patterned features, such as exemplary feature 212 overlying a different material layer 214. In practice, an exemplary image 210 of a patterned material layer may be obtained using a variety of tools and methods, including scanning electron microscopy, optical microscopy, atomic force microscopy and others. A defect or failure 216 is present in the exemplary image 210. The failure 216 is a connection formed between two features that, according to the layout 200 of FIG. 2A, are intended to be separate. Defects like the failure 216 and others may cause a chip to perform unsatisfactorily, decreasing the yield of the wafer, and increasing the cost per satisfactory chip.

In step 114, the information obtained from the failure analysis is used to revise the enhancements performed in step 104. This may include adjusting an OPC feature, adding SRAFs, and/or other features, thereby altering the layout 200 of FIG. 2A. After the revisions to the enhanced layout are completed, the enhanced layout used to create a new, revised mask to implement the desired layout pattern. The performance of the revised mask may be checked again by using it to fabricate a plurality of additional wafers and then checking their performance. If the revised mask provides acceptable results, the revised mask may be used in production. If the revised mask provides unacceptable results, a further revised mask may be produced accord to steps 114, 116, and 118.

Figure 3:
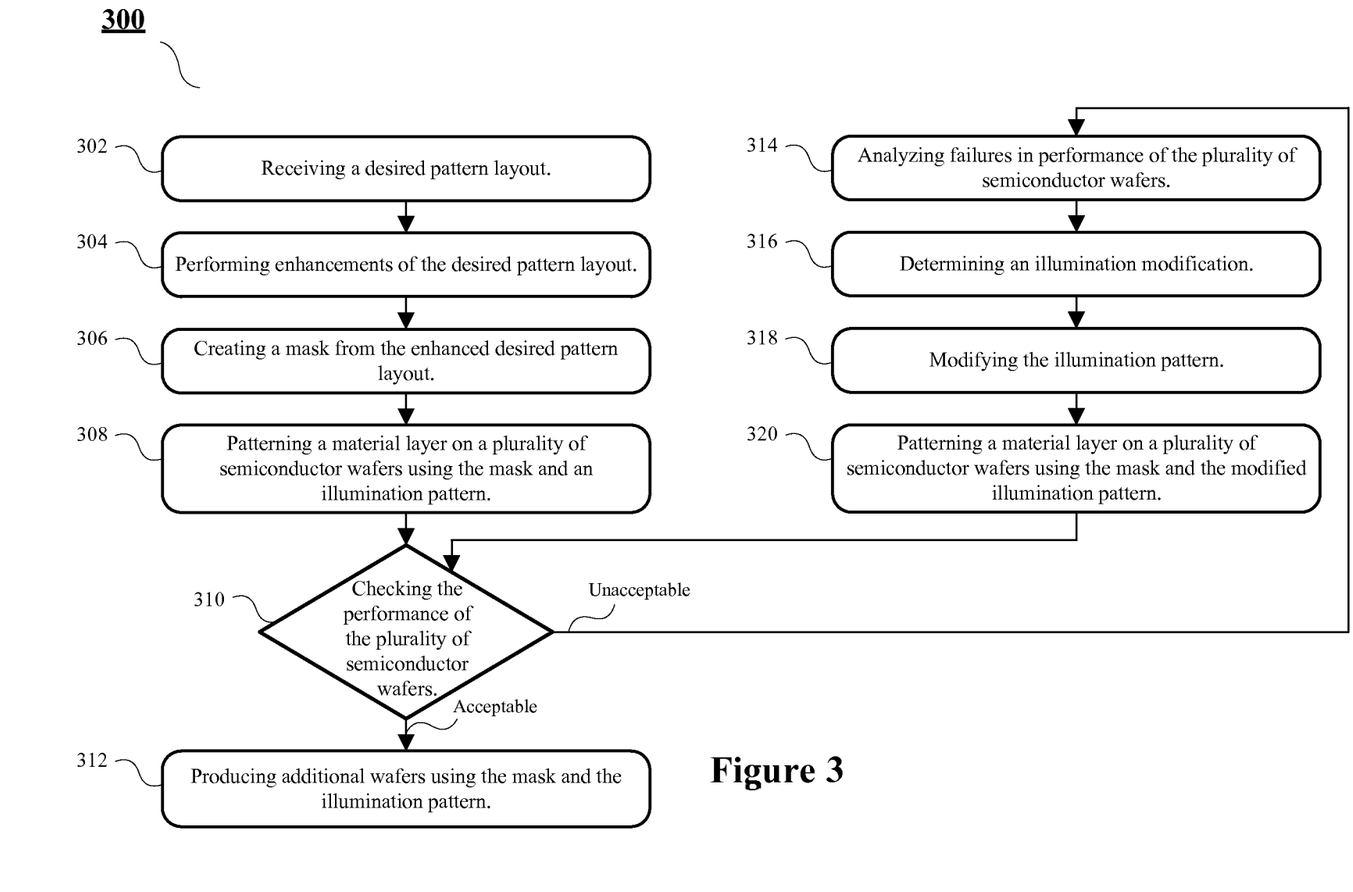
FIG. 3 is a flowchart of a method for improving the performance of semiconductor wafer production, according to some embodiments.

Referring now to FIG. 3, shown therein is a flowchart of a method 300 for improving transference of a mask pattern into a material layer on a semiconductor wafer. The method 300 is illustrated as including several enumerated steps. Various embodiments of the method 300 may include additional steps before, after, in between, and/or as part of the enumerated steps. Some of the steps of the method 300 are similar to some of the steps of the method 100 of FIG. 1. As illustrated, the method 300 begins in step 302 in which a desired pattern layout is received. The desired pattern layout may be received as a computer-readable file, such as GDSII-formatted file. The desired pattern layout defines what portions of a material layer are to remain and what portions are to be removed during semiconductor device fabrication. The material layer may be a photoresist layer, that is subsequently used as an etch stop during an etch process to pattern a target material layer underlying the photoresist layer.

In step 304, enhancements to the desired pattern layout are made to increase the fidelity of the transferred pattern. The enhancements entail modifications to the desired pattern layout, which may cause a new computer-readable file to be generated. The enhancements may include the addition of OPC features, SRAFs, and/or other features. The enhanced desired pattern layout may be the layout 200 as seen in FIG. 2A.

In step 306, a mask is created using the enhanced desired pattern layout created in step 304. The mask may be a conventional mask fabrication process by which an opaque layer of material is formed over a transparent substrate and subsequently patterned by a material removal process, such as e-beam writing. In other embodiments, the semiconductor mask is a phase-shifting mask. Thus, step 306 may be similar to step 106 of method 100.

In step 308, a material layer, such as a photoresist layer, on a plurality of semiconductor wafers is patterned using the mask and an illumination pattern. The illumination pattern may be similar to the illumination pattern 400 as seen in FIG. 4. The illumination pattern 400 is created in the illumination plane by selectively permitting or preventing light from passing along the optical path from the light source in the photolithography system to the wafer. As seen in FIG. 4, the illumination pattern 400 is a stencil and includes an opaque field 402 with openings 404A and 404B. Other embodiments of the illumination pattern may be provided by a diffractive optical element (DOE) or elements or provided by a plurality of controllable micromirrors that are used to selectively deflect light out of or reflect light along the optical path. In yet other embodiments, the openings 404A and 404B may transmit only a portion of the light incident upon them. Other embodiments of the illumination pattern used in step 308 may include different geometries, symmetric and asymmetric, and different numbers of openings, with differing degrees of transparency.

In step 310, the performance of the plurality of wafers patterned in step 308 are checked to ensure proper performance. The plurality of wafers may be test wafers, having been fabricated using an array of combinations of dosage and focus parameter settings. If the plurality of wafers passes the performance check, is acceptable, or if a suitable pair of dosage and focus parameters is identified, additional wafers may be produced in step 312 using the mask, the observed optimal parameters, and the illumination pattern.

However, when the plurality of wafers does not pass the performance check, the failures in performance that caused the plurality of wafers to be unacceptable are analyzed in step 314. This analysis may include collecting data on the type, magnitude, and location of failures, like the failure 216 present on the exemplary image 210 of FIG. 2B.

Figure 5A:
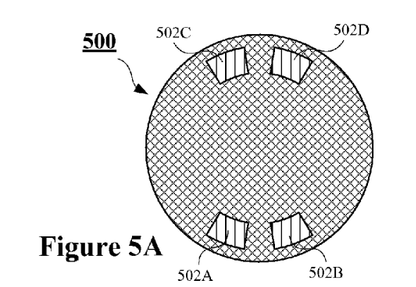
FIGS. 5A, 5B, and 5C illustrate exemplary modifications to the illumination pattern of FIG. 4, according to some embodiments.
Figure 5B:
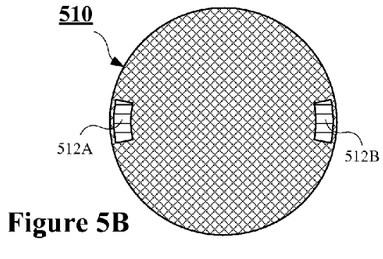
Figure 5C:
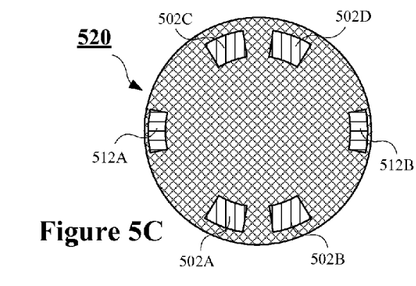

Information collected and synthesized during the analysis of step 314 may be used in step 316 in which an illumination modification is determined. The illumination modification is a modification to the illumination pattern 400 seen in FIG. 4. Some examples of the illumination modification are presented in FIGS. 5A, 5B, and 5C. As seen in FIG. 5A, the illumination modification 500 shown therein includes additional openings 502A, 502B, 502C, and 502D. The additional openings 502A-D are indicated by a diffractive spectrum analysis as being a "favorite spot" or an influential spot in the illumination plane. A positive effect on the performance of pattern transfer is predicted by the analysis for the locations of the openings 502A-D. Accordingly, adding the openings 502A-D to the illumination pattern 400 of FIG. 4 may increase the number of chips passing the performance check. Other embodiments may include openings of different shapes or more or fewer openings. As seen in FIG. 5B, the illumination modification 510 includes opaque blocks 512A and 512B that modify the illumination pattern 400 of FIG. 4 by blocking parts of the openings 404A and 404B. The parts are determined to be unfavorable spots that degrade the transfer of the desired pattern layout into the material layer of a semiconductor wafer, so that when the unfavorable spots of opaque blocks 512A and 512B are blocked from passing light, the fidelity of pattern transfer increases. FIG. 5C illustrates an illumination modification 520 that includes additional openings 502A-D and the opaque blocks 512A and 512B. Thus, some illumination modifications permit additional light through certain portions of the optical path, other illumination modification decrease the light travelling through certain portions of the optical path, and yet other illumination modifications permit additional light in some areas of the optical path while decreasing the light in others.

Figure 6A:
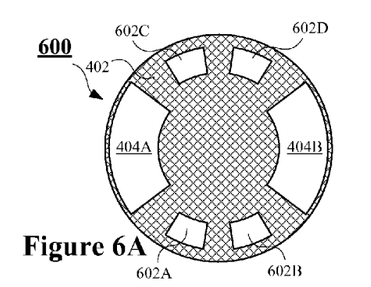
FIGS. 6A, 6B, and 6C are modified illumination patterns as modified according to the exemplary modifications of FIGS. 5A, 5B, and 5C, according to some embodiments.
Figure 6B:
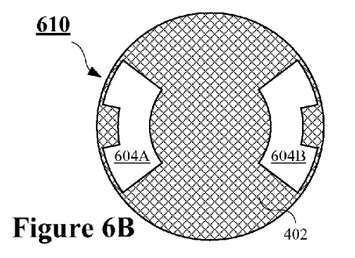
Figure 6C:
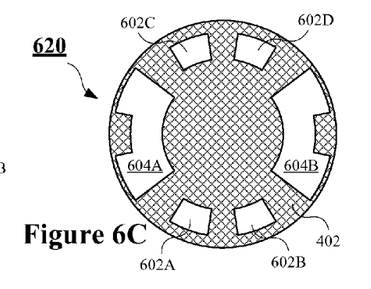

In step 318, the illumination modification is used to modify the illumination pattern, resulting in a modified illumination pattern. For example, when the illumination modification 500 is used, the modified illumination pattern 600, seen in FIG. 6A, is implemented in the optical path. The modified illumination pattern 600 includes an opaque field 402, openings 404A and 404B, and modification openings 602A-D. When the illumination modification 510 is indicated by spectrum analysis, the modified illumination pattern 610 is used. The modified illumination pattern 610 includes an opaque field 402 and openings 604A and 604B. And when the illumination modification 520 is determined, the modified illumination pattern 620 is used. The modified illumination pattern 620 includes an opaque field 402 and openings 602A-D and 604A-B.

The modified illumination pattern, whether 600, 610, or 620, is then used in step 320 in a photolithography process patterning a material layer on a plurality of semiconductor wafers. This may be done by creating a new stencil, or diffractive optical element, or by reprogramming the control of an array of micromirrors. The same mask used in step 308 is used without any modifications. The same lithography parameters achieving the optimal results according to the performance check of step 310 may be used as well.

Thus, the method 300 may be used to improve wafer performance and yields by altering and adjusting the illumination pattern or illumination plane. This is done rather than altering the mask or there enhancements thereto. Significant time may be saved by altering the illumination pattern, as the time to design and fabricate a new mask may be around a week. Use of the method 300 allows an underperforming mask be made adequate, producing an acceptable yield with less time and cost.

Figure 7:
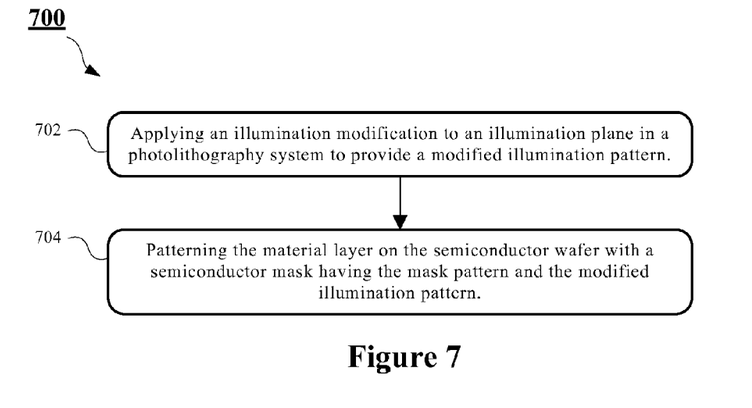
FIG. 7 is a flowchart of another method for improving the performance of semiconductor wafer production, according to some embodiments.

Referring now to FIG. 7, shown therein is a method 700 of improving transference of a mask pattern into a material layer on a semiconductor wafer. The method 700 includes a number of enumerated steps, but embodiments of the method may include additional steps before, after, in between, and/or as part of the enumerated steps. As illustrated, the method 700 begins in step 702 in which an illumination modification is applied to an illumination pattern in a photolithography system to provide a modified illumination pattern. The illumination modification may be similar to the modification 500, 510, and/or 520, as seen in FIGS. 5A, 5B, and 5C. The illumination modification may be the result of a determination of a spectral analysis indicating that the addition of new openings and/or the modification by expansion or contraction of existing openings will improve pattern transfer. In step 704, the material layer on the semiconductor wafer is patterned with a semiconductor mask having the mask pattern and the modified illumination pattern. The method 700 provides a beneficial alternative to the costly and time-consuming iteration of masks.

Figure 8:
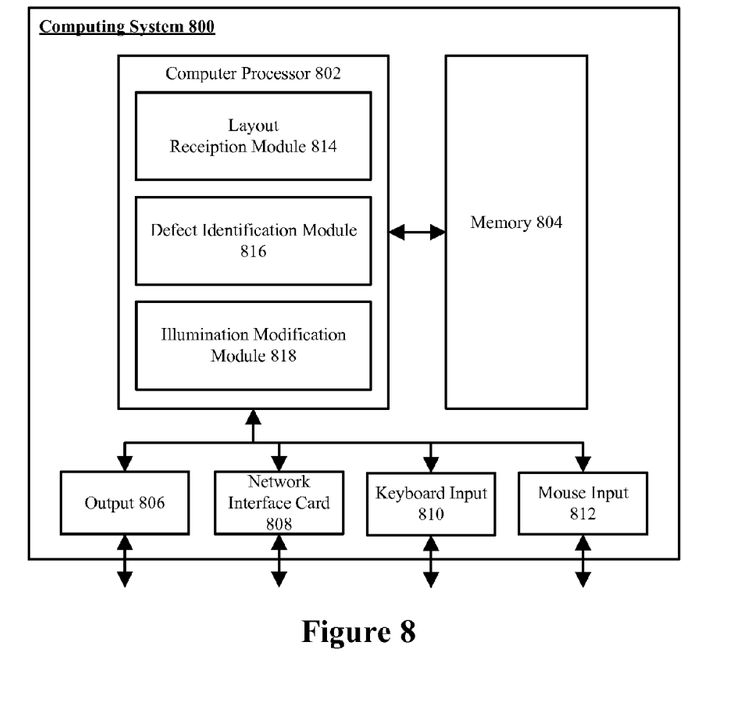
FIG. 8 is a simulation system 800 such as may be used in creating the illustrated modifications of FIGS. 5A, 5B, and 5C, according to some embodiments.
Figure 9:
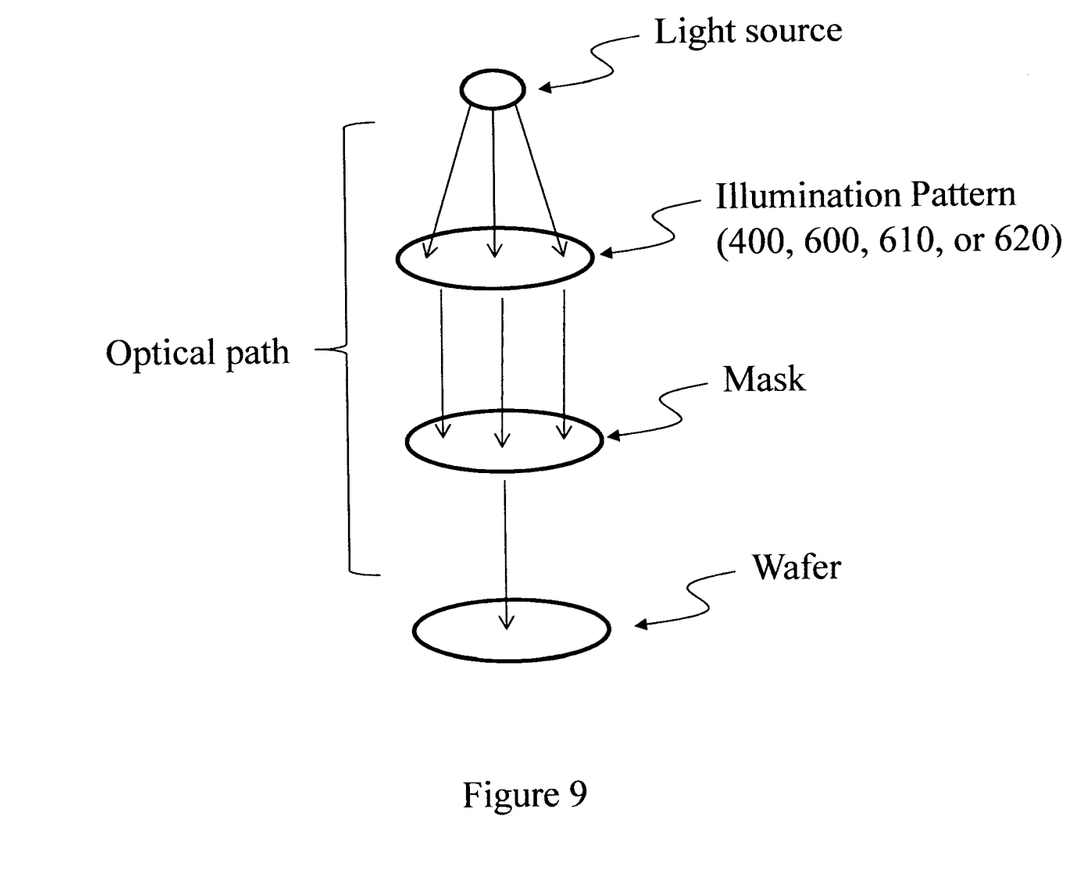
FIG. 9 shows a light source, an illumination pattern, a mask, a wafer, and an optical path from the light source to the wafer.

Referring now to FIG. 8, shown therein is an illumination modification system 800. The system 800 may be used in the methods 300 and 700 in performing certain steps. As illustrated, the system 800 includes a computer processor 802, which may be one or more processors, in communication with a memory 804 such that it is configured to store information in and retrieve information from memory 804. Memory 804 is a tangible, non-transient computer-readable medium, embodiments of which include without limitation RAM or ROM, and instructions stored on other devices (such as hard drives, floppy disks, flash memory, or a CD-ROM, for example). A plurality of input/output mechanisms is provided in the system 800, including an output 806, which may communicate with a display to convey visual information to a user or operator. System 800 includes a network interface card 808 that allows the system 800 to communicate with remote computing and information storage systems. System 800 also includes a keyboard input 810 and a mouse input 812 that allow the operator to interact with the system to enter information and select options. Other inputs and outputs may be included in embodiments of the system 800.

The computer processor 802 provides a plurality of modules that facilitate the simulation of semiconductor processes, include a layout reception module 14, an illumination data module 816, a defect identification module 818, and an illumination modification module 820. Some embodiments of the system 800 may include additional modules. The modules may be provided by the computer processor 802 executing computer-readable instructions stored in the memory 804. In some embodiments, some of the modules are implemented as dedicated hardware devices, while in others, combinations of hardware and software are used to provide the modules.

The layout reception module 814 receives a desired layout as a computer file, such as a layer or layers in a GDSII file or other comparable file. The defect identification module 816 is used in collecting and/or analyzing error and defect data obtained in the performance check of semiconductor wafers. The data may be obtained from various measurements of various features on the wafers. For example, the data analyzed may include a mask error enhancement factor (MEEF). If high MEEF is observed, or another significant correctable error is observed, data is provided to the illumination modification module 818. The illumination modification module 818 is configured to perform a spectral analysis to determine the favorite illumination spots, the areas that if added to the currently used illumination pattern have the most impact. The illumination modification module 818 may determine the illumination modification as seen in FIGS. 5A-C. The use of the illumination modification in a modified illumination pattern may decrease the MEEF or decrease other defect measurements.

In some embodiments, the illumination modification produced by the illumination modification module 818 may be provided to another system to create a stencil having a modified illumination pattern. Alternatively, the information may be provided to a system controlling a plurality of micromirrors to effectuate the modified illumination pattern within a photolithography system.

The methods and systems described herein enable the modification of the illumination pattern present in the optical path of a photolithography system to compensate for observed defects without having to incur the costs and time-delay associated with altering the design and fabrication of a new mask. Thus the methods and systems described herein may save money and time in the fabrication of semiconductor devices.

Some embodiments include a method of improving transference of a mask pattern into a material layer on a semiconductor wafer. The method includes steps of receiving a semiconductor mask made from a desired design layout and of patterning the material layer present on a plurality of semiconductor wafers with the mask having the mask pattern and an illumination pattern. The method further includes steps of identifying defects and/or defect patterns in the transference of the mask pattern on the plurality of semiconductor wafers, determining an illumination modification, and applying the illumination modification to the illumination pattern to create a modified illumination pattern.

Other embodiments include another method of improving transference of a mask pattern into a material layer on a semiconductor wafer. The method includes steps of applying an illumination modification to an illumination pattern in a photolithography system, thereby providing a modified illumination pattern, and patterning the material layer on the semiconductor wafer with a semiconductor mask having the mask pattern and the modified illumination pattern.

Yet other embodiments include an illumination modification system that includes one or more processors in communication a memory, one or more inputs for receiving data from external source or sources, and one or more outputs for communication the at least one modification. The one or more memory modules provide a plurality of modules including an illumination data reception module, a defect identification module, and an illumination modification module. The defect identification module identifies defects and/or patterns of defects in a patterned material layer on a plurality of semiconductor wafers. The illumination modification module determines at least one modification of an illumination pattern used in patterning the patterned material layer. The modification results in mitigation of at least some of the identified defects.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of improving transference of a mask pattern into a material layer on a semiconductor wafer, the method comprising:
   receiving a mask made from a desired design layout, the mask having the mask pattern;
   patterning the material layer present on a plurality of semiconductor wafers with the mask and an illumination pattern;
   identifying a pattern of defects in the transference of the mask pattern on the plurality of semiconductor wafers;
   determining an illumination modification to the illumination pattern so as to compensate the pattern of defects; and
   creating a modified illumination pattern by combining the illumination modification and the illumination pattern, wherein the modified illumination pattern is physically separate from the illumination pattern.

2. The method of claim 1, wherein the illumination pattern and the modified illumination pattern include an opaque area and at least one transparent area.

3. The method of claim 2, wherein the illumination modification increases a ratio of the transparent area to the opaque area in the modified illumination pattern than in the illumination pattern.

4. The method of claim 2, wherein the illumination pattern is provided by a first stencil inserted in an optical path between a light source and the material layer and the modified illumination pattern is provided by a second stencil.

5. The method of claim 1, wherein the illumination pattern is provided by a first diffractive optical element and the modified illumination pattern is provided by a second diffractive optical element.

6. The method of claim 1, wherein the illumination pattern and the modified illumination pattern are provided by a plurality of controllable micromirrors.

7. The method of claim 1, wherein determining an illumination modification comprises:
   identifying a defective area on the plurality of semiconductor wafers; and
   determining a change to the illumination pattern that improves the transference of the mask pattern into the material layer when included in the modified illumination pattern.

8. The method of claim 7, wherein determining a change to the illumination pattern comprises performing a diffractive spectrum analysis on data collected from the pattern of defects.

9. A method of improving transference of a mask pattern into a material layer on a semiconductor wafer, the method comprising:
   applying an illumination modification to an illumination pattern in a photolithography system to provide a modified illumination pattern that is physically separate from the illumination pattern; and
   patterning the material layer on the semiconductor wafer with a mask having the mask pattern and the modified illumination pattern, wherein the mask pattern is made from a desired layout.

10. The method of claim 9, wherein applying the illumination modification to the illumination pattern comprises:
    identifying a pattern of defects in the transference of the mask pattern on a plurality of test semiconductor wafers; and
    determining the illumination modification.

11. The method of claim 10, wherein identifying the pattern of defects comprises comparing the desired layout to corresponding features on the plurality of test semiconductor wafers.

12. The method of claim 10, wherein other lithography parameters used in the transference of the mask pattern on the plurality of test semiconductor wafers are used when patterning the material layer on the semiconductor wafer.

13. The method of claim 9, wherein the illumination modification increases the light transmitted to the material layer when patterning the material layer on the semiconductor wafer.

14. The method of claim 9, wherein the illumination modification decreases the light transmitted to the material layer when patterning the material layer on the semiconductor wafer.

15. The method of claim 9, wherein the mask pattern includes optical proximity correction features.

16. The method of claim 9, wherein the photolithography system includes an extreme ultraviolent (EUV) illumination source.

17. A method, comprising:
   receiving a mask having a mask pattern that is made from a desired integrated circuit (IC) design layout;
   patterning semiconductor wafers with an illumination pattern and the mask;
   identifying a pattern of defects in the transference of the mask pattern on the semiconductor wafers;
   determining an illumination modification to the illumination pattern so as to mitigate the pattern of defects;
   creating a new illumination pattern by combining the illumination modification and the illumination pattern, wherein the new illumination pattern is physically different and separate from the illumination pattern; and
   patterning additional semiconductor wafers with the mask and the new illumination pattern.

18. The method of claim 17, wherein the illumination pattern includes a first plurality of openings, and the new illumination pattern includes the first plurality and a second plurality of openings.

19. The method of claim 17, wherein the new illumination pattern includes an opening that is a part of another opening in the illumination pattern.

20. The method of claim 19, wherein the new illumination pattern further includes additional openings not present in the illumination pattern.

* * * * *